United States Patent [19]

Chen

[11] Patent Number: 5,397,878
[45] Date of Patent: Mar. 14, 1995

[54] POWDER TRANSISTOR DRIVING CIRCUIT OF ELECTROMAGNETIC INDUCTION HEATING DEVICE

[75] Inventor: Su-Min Chen, Chang Hwa Hsien, Taiwan, Prov. of China

[73] Assignee: Superluck Electrics Corp., Chang Hwa Hsien, Taiwan, Prov. of China

[21] Appl. No.: 198,305

[22] Filed: Feb. 18, 1994

[51] Int. Cl.$^6$ .............................................. H05B 6/08
[52] U.S. Cl. ..................................... 219/661; 219/668; 323/289; 323/290; 327/110; 327/427
[58] Field of Search ............... 219/661, 662, 668, 660; 307/571, 246, 247.1, 248, 570, 249, 250; 323/282, 289, 290

[56] References Cited

U.S. PATENT DOCUMENTS

| | | | |
|---|---|---|---|
| 4,473,732 | 9/1984 | Payne | 363/133 |
| 4,555,608 | 11/1985 | Mizukawa et al. | 219/668 |
| 4,560,851 | 12/1985 | Tsukamoto et al. | 219/10.77 |
| 4,847,746 | 7/1989 | Rilly et al. | 363/132 |
| 4,873,460 | 10/1989 | Rippel | 307/571 |
| 4,937,470 | 6/1990 | Zeiler | 307/270 |
| 4,983,865 | 1/1991 | Ho et al. | 307/571 |
| 5,140,201 | 8/1992 | Uenishi | 307/571 |
| 5,144,547 | 9/1992 | Masamoto | 363/127 |
| 5,204,504 | 4/1993 | Tanaka | 219/715 |
| 5,276,357 | 1/1994 | Cripe | 307/270 |

*Primary Examiner*—Philip H. Leung
*Attorney, Agent, or Firm*—Browdy and Neimark

[57] ABSTRACT

A power transistor driving circuit for use in an electromagnetic induction heating device comprises an induction coil circuit and a driving circuit. The induction coil circuit is provided with an induction connected with an oscillating circuit made up of capacitances and resistances. The oscillating circuit is provided with at least one power transistor for producing a high frequency switching. The driving circuit comprises at least one quick switching circuit provided with two transistors between which a resistance and an inductance are connected therewith in series. One end of the inductance is connected with the gate of the power transistor for accelerating the reverse current flow of the gate so as to shorten the switching time of the power transistor and to reduce the switching power loss of the power transistor at the time when the power transistor is turned off.

5 Claims, 2 Drawing Sheets

POWDER TRANSISTOR DRIVING CIRCUIT OF ELECTROMAGNETIC INDUCTION HEATING DEVICE

FIELD OF THE INVENTION

The present invention relates generally to an electromagnetic induction heating drive circuit, and more particularly to an improved power transistor driving circuit of an electromagnetic induction heating device.

BACKGROUND OF THE INVENTION

The U.S. Pat. Nos. 4,473,732; 4,560,851 and 4,847,746 disclose the applications of a high frequency switching circuit to the electromagnetic induction heating device. Such applications generally involve various high frequency switching circuits which are designed differently. The U.S. patent Ser. No. 07/858283, the German Patent G9204812.9 and the Taiwanese Patent 85167 disclose a novel dual push-pull induction heating circuit. The circuits mentioned above are aimed at regulating one or two power transistors to act on the ON-OFF switching so as to control the induction coil to output the high frequency switching circuit. In other words, the power transistor must bear a considerably high transient collect voltage and a considerably high transient collect current. In addition, the switching power loss of the power transistor is great. As a result, a power transistor having a greater collect loss specification must be used in the circuit. A greater switching power loss is often responsible for the high rate of the breakdown of the power transistor.

The power transistor having a greater collect loss specification is generally expensive and bulky. In addition, such a power transistor as described above generates a considerable heat, which must be radiated by a heat-radiating means, thereby undermining the efficiency of the electromagnetic heating device. The switching power loss of the power transistor can be reduced by lessening the value of resistance of the power transistor gate at the risk of causing a voltage surge in the drive circuit.

SUMMARY OF THE INVENTION

It is therefore the primary objective of the present invention to provide an electromagnetic induction heating device with a power transistor drive circuit capable of shortening the switching time of the power transistor for reducing the switching power loss.

It is another objective of the present invention to provide an electromagnetic induction heating device with a power transistor drive circuit comprising a power transistor having a small collect loss and a small volume. Such a power transistor is cost efficient and generates less heat.

It is still another objective of the present invention to provide an electromagnetic induction heating device with a power transistor drive circuit which is simple in construction and less vulnerable to breakdown.

The foregoing objectives of the present invention are attained by a power transistor drive circuit comprising at least two transistors and a quick switching circuit between two emitters of the two transistors. The quick switching circuit is made up of an inductance and a resistance. One end of the inductance is connected with the gate of the power transistor while another end of the inductance is connected with the emitter of one transistor. As the power transistor is turned off, the power transistor gate produces a negative voltage to accelerate the reverse flow of the emitter current so as to lessen the switching power loss by shortening the switching time of the power transistor.

DETAILED DESCRIPTION OF THE INVENTION

Figure 1:
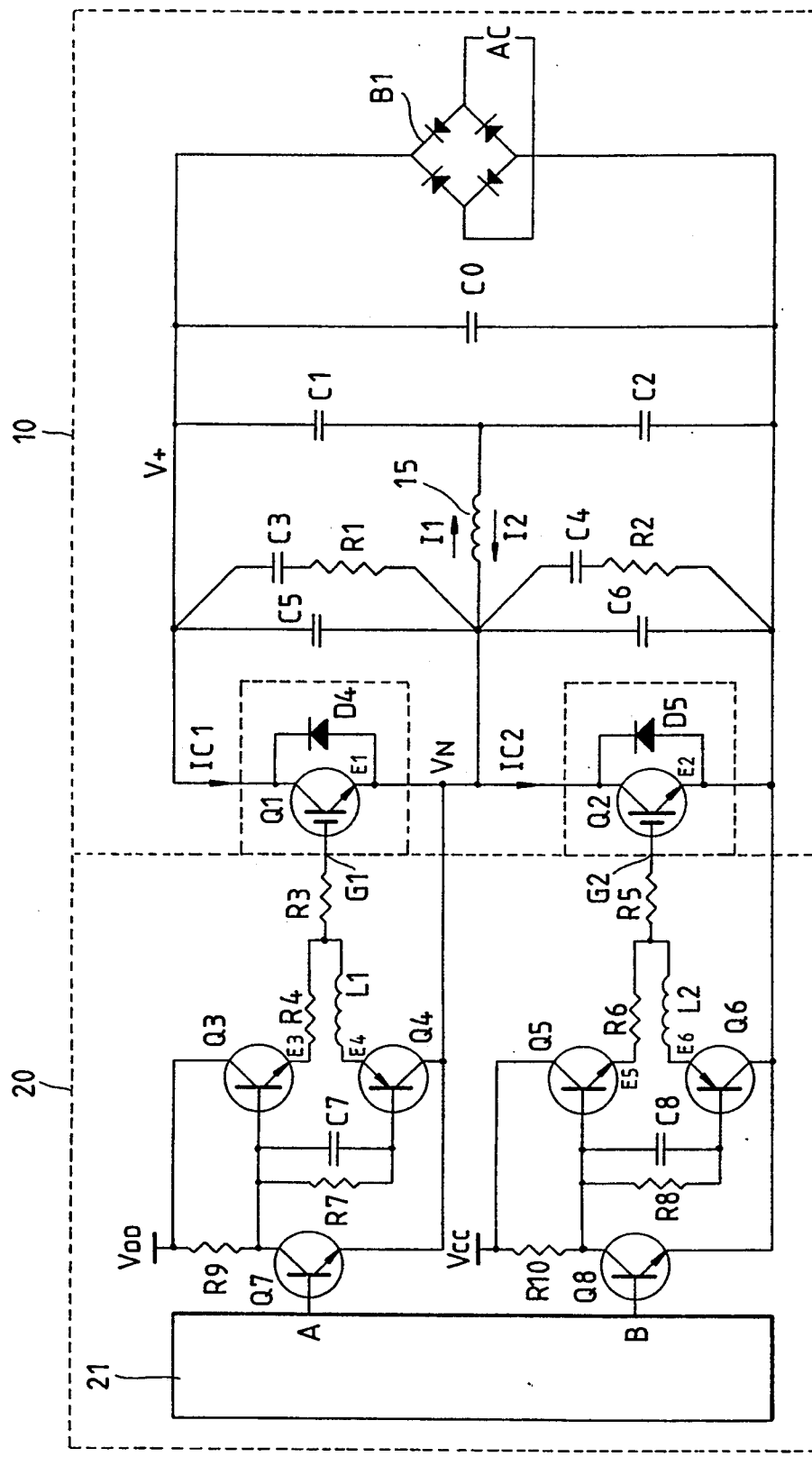
FIG. 1 shows a circuitry of the power transistor drive circuit of an electromagnetic induction heating device, according to the present invention.
Figure 2:
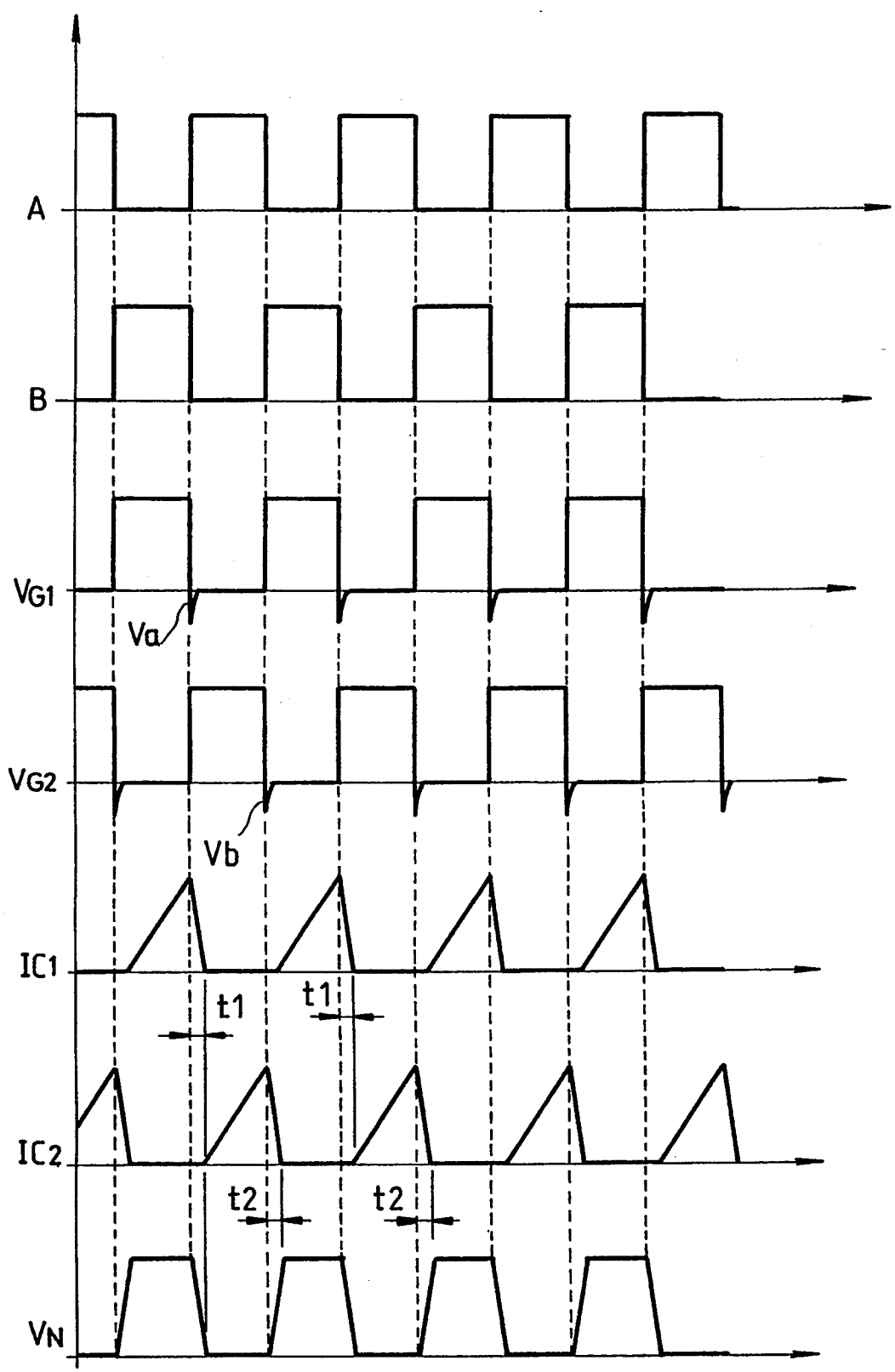
FIG. 2 shows a wave form diagram of some of connection points of the circuitry as shown in FIG. 1.

As shown in FIGS. 1 and 2, a power transistor driving circuit embodied in the present invention comprises an induction coil circuit 10 and a drive circuit 20. The induction coil circuit 10 is composed of a bridge-type rectifier B1 serving to rectify the alternating current to the direct current. The rectifier B1 is connected via a filtering capacitance C0 with an oscillating circuit made up of an induction coil 15, capacitances C1, C2, C3, C4, C5, C6, and resistances R1 and R2. Two power transistors Q1 and Q2 are insulated gate bipolar transistors and are connected in series with the oscillating circuit. The drive circuit 20 are connected with the gates G1 and G2 of the two power transistors Q1 and Q2. When the power transistor Q1 is turned on, the current I1 flows through the induction coil 15. As the power transistor Q2 is subsequently turned on, the current I2 flows through the induction coil 15, which is caused to oscillate repeatedly at a high frequency so as to induce the bottom of a cookware placed on the induction coil to generate an alternating current of high potential for heating the bottom of the cookware. The induction switching circuit 10 of the present invention is similar to that of the prior art.

The drive circuit 20 comprises a switching circuit 21, which serves to send out the alternating high-low signal via two connection points A and B, as shown in FIG. 2. The connection point A is connected with the driving circuit made up of transistors Q3, Q4, Q7, resistances R3, R4, R7, R9, the capacitance C7, and the inductance L1, with its output end being connected with the gate G1 of the power transistor Q1 for turning the power transistor Q1 on or off. The connection point B is connected with the driving circuit made up of transistors Q5, Q6, Q8, the resistances R5, R6, R8, R10, the capacitance C8, and the inductance L2, with its output end being connected with the gate G2 of the power transistor Q2 for turning the power transistor Q2 on or off. In other words, the drive circuit 20 serves to regulate the ON/OFF switching motions of the two power transistors Q1 and Q2.

The transistor Q3 of the drive circuit 20 of the present invention is of a PNP type and is provided with an emitter E3 which is connected with one end of the resistance R4. Another end of the resistance R4 is connected with the resistance R3 and an inductance L1 which is in turn connected at another end thereof with an emitter E4 of the transistor Q4 of the NPN type. In other words, a quick switching circuit is formed by the transistors Q3 and Q4, the resistances R3 and R4, and the inductance L1. Similarly, another quick switching circuit is formed by the transistors Q5 and Q6 whose emitters E5 and E6 are connected in series with the resistance R6 and the inductance L2. A transient negative voltage is produced by these two quick switching circuits by means of the inductances L1 and L2 respectively at the time when the power transistors Q1 and Q2 are turned off. The turn-off time is shortened by the accelerated reverse flow of the emitting currents of the power transistors Q1 and Q2. As illustrated in FIG. 2, when the power transistor Q1 is turned off, a transient negative voltage Va is produced by virtue of the fact that VG1 is changed from a high potential to a low potential. In other words, the difference in potential between the emitter E1 and the gate G1 is increased so as to accelerate the reverse flow of the emitting current of the power transistor. As a result, the turn-off time t1 of the power transistor is so shortened that the switching power loss of the power transistor Q1 is reduced. Similarly, a transient negative voltage vb is produced in the process in which VG2 is changed from a high potential to a low potential at the time when the power transistor Q2 is turned off. As a result, the difference in potential between the emitter E2 and the gate G2 is so increased as to accelerate the reverse flow of the emitting current of the power transistor Q2. The turn-off time t2 of the power transistor Q2 is therefore so shortened that the switching power loss of the power transistor Q2 is reduced.

In conclusion, the gate of the power transistor of the power transistor driving circuit of the present invention is connected with the quick switching circuit so as to shorten the switching time to reduce the switching power loss of the power transistor. As a result, less heat is generated by the power transistor. In addition, the power transistor driving circuit of the present invention can be made economically in view of the fact that the power transistors Q1 and Q2 have a relatively small collect loss, a small size, and an excellent heat-radiating effect. The service life span of the power elements of the present invention is prolonged effectively. It is therefore readily apparent that an electromagnetic induction heating device equipped with the power transistor driving circuit of the present invention is durable and less vulnerable to breakdown.

The embodiment of the present invention described above is to be regarded in all respects as merely illustrative and not restrictive. Accordingly, the present invention may be embodied in other specific forms without deviating from the spirit thereof. The present invention is therefore to be limited only by the scope of the following appended claims.

What is claimed is:

1. An electromagnetic induction heating device having a power transistor driving circuit,
    said power transistor driving circuit comprising an induction coil circuit and a driving circuit;
    said induction coil circuit including
        an induction coil connected with an oscillating circuit,
        and at least one power transistor for producing a high frequency switching action,
        said oscillating circuit including a plurality of capacitances and resistances;
    said driving circuit including
        at least two transistors,
        a quick switching circuit connected between said at least two transistors,
        said quick switching circuit including
            at least one inductance having one end connected with a gate of said at least one power transistor for turning said power transistor on or off, with said inductance used to accelerate a reverse current flow of said gate of said power transistor so as to shorten a switching time of said power transistor at the time when said power transistor is turned off.

2. The power transistor driving circuit of claim 1 wherein one of said two transistors is of PNP type and provided with an emitter; wherein another one of said two transistors is of NPN type and provided with an emitter; and wherein said inductance is connected between said emitters of said two transistors and is connected via a resistance with said gate of said power transistor.

3. The power transistor driving circuit of claim 2 wherein said inductance is connected respectively with a resistance between said emitter of said PNP-type transistor and said gate of said power transistor.

4. The power transistor driving circuit of claim 1 wherein said induction coil circuit is provided with a dual push-pull switching circuit having two power transistors, each of said two power transistors having a gate which is connected with a driving circuit which is in turn provided with a quick switching circuit.

5. An electromagnetic induction heating device having a power transistor driving circuit,
    said power transistor driving circuit comprising an induction coil circuit and a driving circuit;
    said induction coil circuit including
        an induction coil connected with an oscillating circuit,
        and at least one power transistor for producing a high frequency switching action,
        said oscillating circuit including a plurality of capacitances and resistances;
    said driving circuit including
        at least two transistors,
        a quick switching circuit connected between said at least two transistors,
        said quick switching circuit including
            at least one inductance having one end connected with a gate of said at least one power transistor for turning said power transistor on or off,
            said at least one inductance having said one end also connected to one of said at least two transistors,
            said at least one inductance having its other end connected to another of said at least two transistors
    whereby said inductance is used to accelerate a reverse current flow of said gate of said power transistor so as to shorten a switching time of said power transistor at the time when said power transistor is turned off.

* * * * *